(12) United States Patent
Chiu et al.

(10) Patent No.: US 12,463,623 B2
(45) Date of Patent: Nov. 4, 2025

(54) PHASE ERROR COMPENSATION CIRCUIT AND METHOD FOR COMPENSATING PHASE ERROR BETWEEN REFERENCE CLOCK AND FEEDBACK CLOCK

(71) Applicant: MEDIATEK INC., Hsin-Chu (TW)

(72) Inventors: Wei-Hao Chiu, Hsinchu (TW);
Song-Yu Yang, Hsinchu (TW);
Ang-Sheng Lin, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 121 days.

(21) Appl. No.: 18/234,346

(22) Filed: Aug. 15, 2023

(65) Prior Publication Data

US 2024/0171162 A1     May 23, 2024

Related U.S. Application Data

(60) Provisional application No. 63/426,318, filed on Nov. 17, 2022.

(51) Int. Cl.
| | |
|---|---|
| *H03K 5/01* | (2006.01) |
| *H03L 7/08* | (2006.01) |
| *H03K 5/00* | (2006.01) |

(52) U.S. Cl.
CPC ............... *H03K 5/01* (2013.01); *H03L 7/08* (2013.01); *H03K 2005/00058* (2013.01)

(58) Field of Classification Search
None
See application file for complete search history.

(56) References Cited

U.S. PATENT DOCUMENTS

| | | |
|---|---|---|
| 8,362,815 B2 | 1/2013 | Pavlovic |
| 10,895,850 B1 | 1/2021 | Elkholy |
| 11,223,362 B2 | 1/2022 | Chiu |

(Continued)

OTHER PUBLICATIONS

Nereo Markulic, Kuba Raczkowski, Ewout Martens, Pedro Emiliano Paro Filho, Benjamin Hershberg, Piet Wambacq, Jan Craninckx, "A Self-Calibrated 10Mb/s Phase Modulator with −37.4dB EVM Based on a 10.1-to-12.4GHz, -246.6dB-FOM, Fractional-N Subsampling PLL", 2016 IEEE ISSCC, IEEE, USA, Jan. 31, 2016.

(Continued)

*Primary Examiner* — Cassandra F Cox
(74) *Attorney, Agent, or Firm* — Winston Hsu

(57) ABSTRACT

A phase error compensation circuit and a method for compensating a phase error between a reference clock and a feedback clock are provided. The phase error compensation circuit includes a first programmable delay circuit, a second programmable delay circuit and at least one swapping circuit. The first programmable delay circuit provides a first delay. The second programmable delay circuit provides a second delay. At a present cycle, the first delay is unchanged, wherein the swapping circuit applies the first delay to the feedback clock for generating a compensated feedback clock and applies the second delay to the reference clock for generating a compensated reference clock. At a next cycle, the second delay is unchanged, where the swapping circuit applies the second delay to the feedback clock for generating the compensated feedback clock and applies the first delay to the reference clock for generating the compensated reference clock.

18 Claims, 7 Drawing Sheets

(56) References Cited

U.S. PATENT DOCUMENTS 11,387,833 B1 * 7/2022 Li .......................... H03L 7/081

OTHER PUBLICATIONS

Wanghua Wu, Chih-Wei Yao, Kunal Godbole, Ronghua Ni, Pei-Yuan Chiang, Yongping Han, Yongrong Zuo, Ashutosh Verma, Ivan Siu-Chuang Lu, Sang Won Son, Thomas Byunghak Cho, "A 5.5-7.3 GHZ Analog Fractional-N Sampling PLL in 28-nm CMOS with 75 fsrms Jitter and −249.7 dB FoM", 2018 IEEE RFIC, IEEE, USA, Jun. 10, 2018.

* cited by examiner

PHASE ERROR COMPENSATION CIRCUIT AND METHOD FOR COMPENSATING PHASE ERROR BETWEEN REFERENCE CLOCK AND FEEDBACK CLOCK

CROSS REFERENCE TO RELATED APPLICATIONS

This application claims the benefit of U.S. Provisional Application No. 63/426,318, filed on Nov. 17, 2022. The content of the application is incorporated herein by reference.

BACKGROUND

The present invention is related to phase error compensation, and more particularly, to a phase error compensation circuit and a method for compensating a phase error between a reference clock and a feedback clock, which are applicable to a fractional-N phase-locked loop (PLL).

A fractional-N PLL is capable of supporting fine-resolution frequency tuning, and is therefore likely to be implemented as a frequency synthesizer in a radio frequency (RF) transceiver. There are some induced problems that need to be handled, however. For example, a fractional-N PLL obtains an equivalent fractional divisor by modulating an divided-by-integer frequency divider (e.g. by modulating an integer divisor thereof), which leaves residual phase errors (e.g. fractional phase error and quantization phase error) in each cycle of a reference clock, such that unwanted noise and spurs appear on an output spectrum.

To deal with the above problems, a digital-to-time converter (DTC) may be configured to apply a proper delay to an input signal of the fractional-N PLL (e.g. a reference clock) before detecting a phase error between the reference clock and a feedback clock, thereby reducing the residual phase errors. This proposal still faces some challenges, however. For example, mismatch issues exist in the DTC, which results in an incorrect output delay due to nonlinear transfer of a digital-to-time conversion, and therefore raised folded-in noise floor and spurs on the output spectrum are induced. Thus, complex hardware or algorithms are needed for calibrating the DTC, which typically takes additional time for completing the calibration, leading to a slower PLL settling (i.e. a longer settling time).

Thus, there is a need for a novel architecture and an associated method, in order to improve the linearity of the DTC within the fractional-N PLL without introducing any side effect or in a way that is less likely to introduce side effects.

SUMMARY

An objective of the present invention is to provide a phase error compensation circuit and a method for compensating a phase error between a reference clock and a feedback clock, which are applicable to a fractional-N phase-locked loop (PLL), in order to improve linearity of a digital-to-time converter (DTC) within the fractional-N PLL without adopting additional DTC calibration.

At least one embodiment of the present invention provides a phase error compensation circuit for compensating a phase error between a reference clock and a feedback clock. The phase error compensation circuit comprises a first programmable delay circuit, a second programmable delay circuit and at least one swapping circuit, wherein the at least one swapping circuit is coupled to the first programmable delay circuit and the second programmable delay circuit. The first programmable delay circuit is configured to provide a first delay. The second programmable delay circuit is configured to provide a second delay. The at least one swapping circuit is configured to output a compensated reference clock and a compensated feedback clock according to the first delay, the second delay, the reference clock and the feedback clock. At a present cycle, the at least one swapping circuit is configured to apply the first delay to the feedback clock for generating the compensated feedback clock and apply the second delay to the reference clock for generating the compensated reference clock. At a next cycle, the at least one swapping circuit is configured to apply the second delay to the feedback clock for generating the compensated feedback clock and apply the first delay to the reference clock for generating the compensated reference clock. In addition, the first delay at the present cycle is substantially equal to the first delay at a last cycle, and the second delay at the present cycle is substantially equal to the second delay at the next cycle.

At least one embodiment of the present invention provides a method for compensating a phase error between a reference clock and a feedback clock, wherein the method is applicable to a phase error compensation circuit. The method comprises: utilizing a first programmable delay circuit of the phase error compensation circuit to provide a first delay; utilizing a second programmable delay circuit of the phase error compensation circuit to provide a second delay; at a present cycle, utilizing at least one swapping circuit of the phase error compensation circuit to apply the first delay to the feedback clock for generating a compensated feedback clock and apply the second delay to the reference clock for generating a compensated reference clock; and at a next cycle, utilizing the at least one swapping circuit to apply the second delay to the feedback clock for generating the compensated feedback clock and apply the first delay to the reference clock for generating the compensated reference clock. In addition, the first delay at the present cycle is substantially equal to the first delay at a last cycle, and the second delay at the present cycle is substantially equal to the second delay at the next cycle.

The embodiments of the present invention utilize two programmable delay circuits (e.g. two DTCs) for compensating the phase error and self-error cancellation. In specific, when one of the two programmable delay circuits is configured to perform the self-error cancellation (e.g. applying the same delay but different signal), the other one is configured to compensate the phase error in conjunction with the delay which is utilized for the self-error cancellation. As the errors induced by mismatch issues of the DTCs are self-cancelled, related calibration regarding the DTC is not required. Thus, the proposed phase error compensation circuit can be applied to a fractional-N PLL, to reduce the residual phase error of the fractional-N PLL without additional calibration hardware or algorithms, thereby improving an overall performance of the fractional-N PLL without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
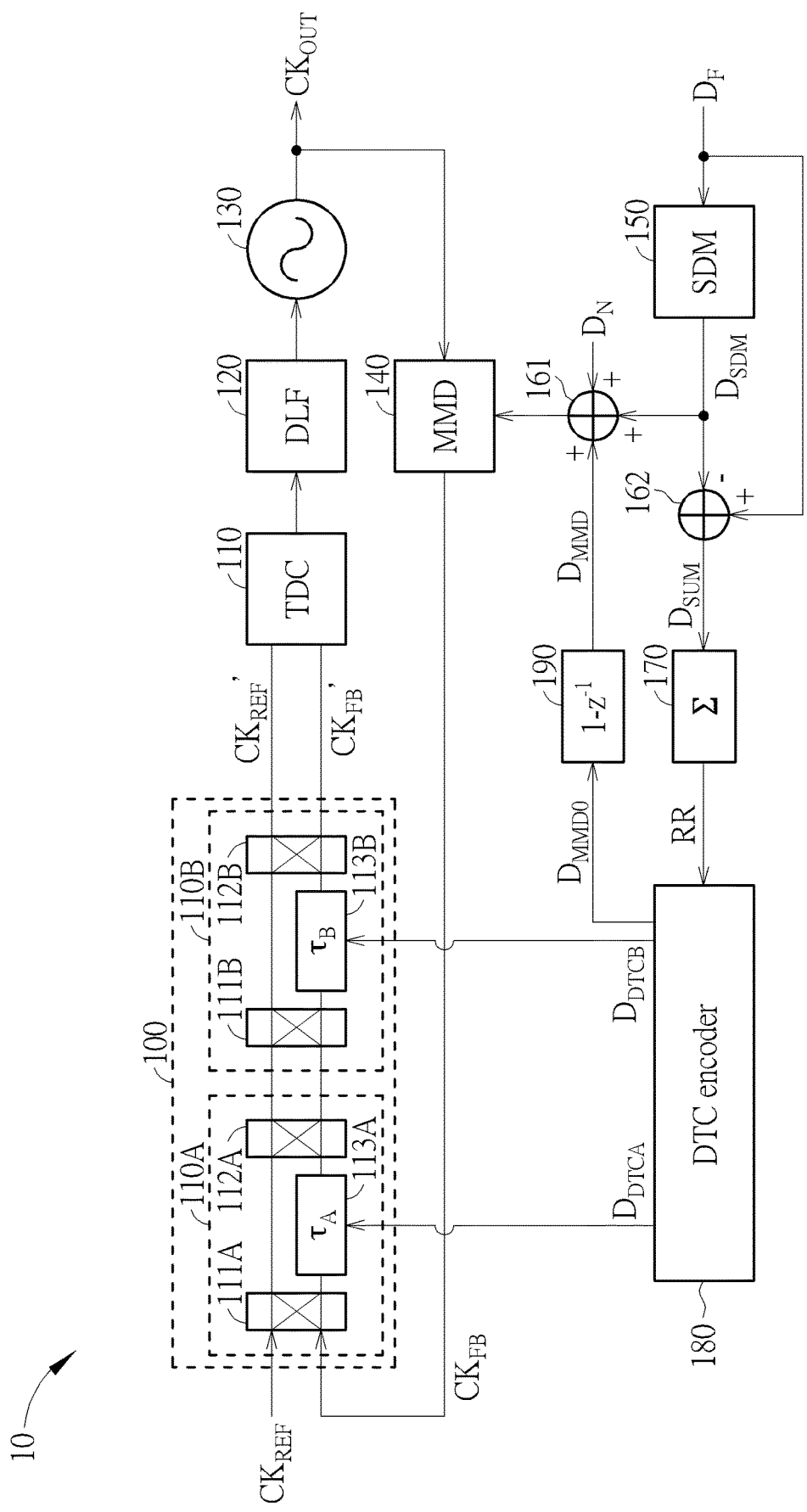
FIG. 1 is a diagram illustrating a fractional-N phase-locked loop according to an embodiment of the present invention.

FIG. 1 is a diagram illustrating a fractional-N phase-locked loop (PLL) 10 according to an embodiment of the present invention. As shown in FIG. 1, the fractional-N PLL 10 may comprise a phase error compensation circuit 100, a time-to-digital converter (TDC) 110, a digital loop filter (DLF) 120, a digital controlled oscillator (DCO) 130, a multi-modulus divider (MMD) 140, a sigma-delta modulator 150, an adder 161, a subtracter 162, an accumulator 170 (labeled "$\Sigma$" in FIG. 1 for brevity), an encoder of digital-to-time converters (DTCs) such as a DTC encoder 180, and a control logic circuit 190 (labeled "1-$z^{-1}$" in FIG. 1 for brevity). In this embodiment, the phase error compensation circuit 100 may apply corresponding phase shifts (e.g. delays) to a reference clock $CK_{REF}$ and a feedback clock $CK_{FB}$, respectively, in order to transmit a residual phase error (e.g. a phase error between a compensated reference clock $CK_{REF}'$ and a compensated feedback clock $CK_{FB}'$, which is less than a phase error between the reference clock $CK_{REF}$ and the feedback clock $CK_{FB}$) to the TDC 110. The TDC 110 may convert the residual phase error into a digital code for being processed by the DLF 120. The DLF 120 may generate a control code according to the digital code (e.g. by performing low pass filter on the digital code), and transmit the control code to the DCO 130. The DCO 130 may output an oscillation clock $CK_{OUT}$, where a frequency of the oscillation clock $CK_{OUT}$ is determined by the control code. The MMD 140 may divide the frequency of the oscillation clock $CK_{OUT}$ by a variable integer divisor to generate the feedback clock $CK_{FB}$.

In this embodiment, the phase error compensation circuit 100 may comprise a first programmable delay circuit such as a DTC 113A, a second programmable delay circuit such as a DTC 113B, and at least one swapping circuit such as input swapping circuits 111A and 111B and output swapping circuits 112A and 112B. The at least one swapping circuit is couple to the DTCs 113A and 113B. For example, the DTC 113A is coupled between the input swapping circuit 111A and the output swapping circuit 112A, and the DTC 113B is coupled between the input swapping circuit 111B and the output swapping circuit 112B. The phase error compensation circuit 100 may be regarded as a cascaded circuit of two alternating DTCs such as 110A and 110B, where the input swapping circuit 111A, the DTC 113A and the output swapping circuit 112A may belong to the alternating DTC 110A, and the input swapping circuit 111B, the DTC 113B and the output swapping circuit 112B may belong to the alternating DTC 110B. It should be noted that detailed implementation of the at least one swapping circuit shown in FIG. 1 of for illustrative purposes only, and is not meant to be a limitation of the present invention. Subsequent paragraphs will describe several examples of the at least one swapping circuit in detail.

In this embodiment, the DTC 113A is configured to provide a first delay such as a delay $\tau_A$ (labeled "$\tau_A$" on the DTC 113A in FIG. 1 for better comprehension) which is controlled by an encoded code $D_{DTCA}$, and the DTC 113B is configured to provide a second delay such as a delay $\tau_B$ (labeled "$\tau_B$" on the DTC 113A in FIG. 1 for better comprehension) which is controlled by an encoded code $D_{DTCB}$. The at least one swapping circuit is configured to output the compensated reference clock $CK_{REF}'$ and the compensated feedback clock $CK_{FB}'$ according to the delay $\tau_A$, the delay $\tau_B$, the reference clock and the feedback clock $CK_{FB}$. For example, at a present cycle (e.g. a present cycle of the reference clock $CK_{REF}$), the at least one swapping circuit is configured to apply the delay $\tau_A$ to the feedback clock $CK_{FB}$ for generating the compensated feedback clock $CK_{FB}'$ and apply the delay $\tau_B$ to the reference clock $CK_{REF}$ for generating the compensated reference clock $CK_{REF}'$. At a next cycle (e.g. a next cycle of the reference clock $CK_{REF}$), the at least one swapping circuit is configured to apply the delay $\tau_B$ to the feedback clock $CK_{FB}$ for generating the compensated feedback clock $CK_{FB}'$ and apply the delay TA to the reference clock $CK_{REF}$ for generating the compensated reference clock $CK_{REF}'$. More particularly, the delay TA at the present cycle is substantially equal to the delay TA at a last cycle (e.g. a last cycle of the reference clock $CK_{REF}$), and the delay $\tau_B$ at the present cycle is substantially equal to the delay $\tau_B$ at the next cycle.

In this embodiment, an integer part of an overall divisor of the fractional-N PLL 10 may be represented by a digital code $D_N$, and a fractional part of the overall divisor may be represented by a digital code $D_F$. The SDM 150 is configured to modulate the digital code $D_F$ to generate a modulated code $D_{SDM}$, and a difference between the digital code $D_F$ and the modulated code $D_{SDM}$ (i.e. a difference code $D_{SUM}$) may be accumulated by the accumulator 170 in order to generate an accumulated code RR, where the accumulated code RR may be utilized for predict a pattern of the phase error between the reference clock $CK_{REF}$ and the feedback clock $CK_{FB}$, and the DTC encoder 180 is configured to generate the encoded codes $D_{DTCA}$ and $D_{DTCB}$ according to the accumulated code RR, in order to make an equivalent phase shift provided by the phase error compensation circuit 100 be substantially equal to the phase error between the reference clock $CK_{REF}$ and the feedback clock $CK_{FB}$, thereby minimizing the residual phase error output from the phase error compensation circuit 100. When the residual phase error is minimized, a design requirement (e.g. an input range) of the TDC 110 can be relaxed.

In addition, the variable integer divisor of the MMD 140 may be determined by a summation of the digital code $D_N$, the modulated code $D_{SDM}$ and a modified code Dom, where the DTC encoder 180 may output a modified code $D_{MMD0}$ according to preliminary values of the encoded code $D_{DTCA}$ and $D_{DTCB}$, and the control logic 190 may selectively change or refresh the modified code $D_{MMD}$ according to the modified code $D_{MMD0}$, in order to selectively change or refresh the variable integer divisor of the MMD 140. Related details will be described in subsequent paragraphs.

Figure 2:
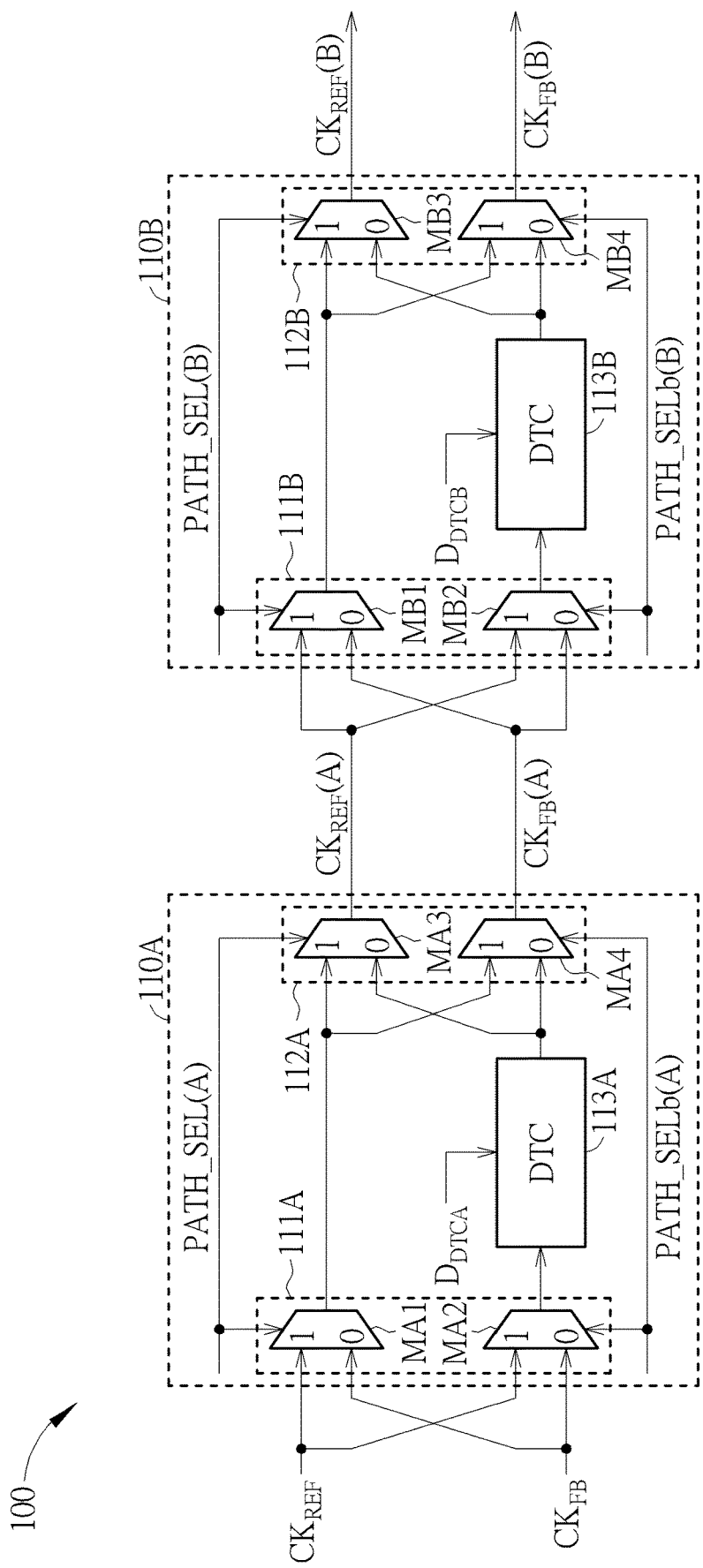
FIG. 2 is a diagram illustrating a phase error compensation circuit according to an embodiment of the present invention.

FIG. 2 is a diagram illustrating the phase error compensation circuit 100 according to an embodiment of the present invention. As mentioned above, the at least one swapping circuit may comprise the input swapping circuit 111A, the output swapping circuit 112A, the input swapping circuit 111B and the output swapping circuit 112B, where the DTC 113A is coupled between the input swapping circuit 111A and the output swapping circuit 112A, and the DTC 113B is coupled between the input swapping circuit 111B and the output swapping circuit 112B. In this embodiment, the input swapping circuit 111A is configured to receive the reference clock $CK_{REF}$ and the feedback clock $CK_{FB}$. The output swapping circuit is configured to output an intermediate reference clock $CK_{REF}(A)$ and an intermediate feedback clock $CK_{FB}(A)$ according to a delay provided by the DTC 113A (e.g. the delay TA mentioned above), the reference clock $CK_{REF}$ and the feedback clock $CK_{FB}$. The input swapping circuit 111B is configured to receive the intermediate reference clock $CK_{REF}(A)$ and the intermediate feedback clock $CK_{FB}(A)$. The output swapping circuit is configured to output a compensated reference clock $CK_{REF}(B)$ (which may be an example of the compensated reference clock $CK_{REF}'$) and a compensated feedback clock $CK_{FB}(B)$ (which may be an example of the compensated feedback clock $CK_{FB}'$) according to a delay provided by the DTC 113B (e.g. the delay $\tau_B$ mentioned above), the intermediate reference clock $CK_{REF}(A)$ and the intermediate feedback clock $CK_{FB}(A)$.

In detail, the input swapping circuit 111A may comprise multiplexers (MUXs) MA1 and MA2, the output swapping circuit 112A may comprise MUXs MA3 and MA4, the input swapping circuit 111B may comprise MUXs MB1 and MB2, and the output swapping circuit 112B may comprise MUXs MB3 and MB4. The MUXs MA1 and MA3 are controlled by a control signal PATH_SEL(A), and the MUXs MA2 and MA4 are controlled by a control signal PATH_SELb(A), where the control signal PATH_SELb(A) may be an inverter signal of the control signal PATH_SEL(A). The MUXs MB1 and MB3 are controlled by a control signal PATH_SEL(B), and the MUXs MB2 and MB4 are controlled by a control signal PATH_SELb(B), where the control signal PATH_SELb(B) may be an inverter signal of the control signal PATH_SEL(B). In addition, the control signal PATH_SEL(B) is an inverted signal of the control signal PATH_SEL(A).

Figure 3:
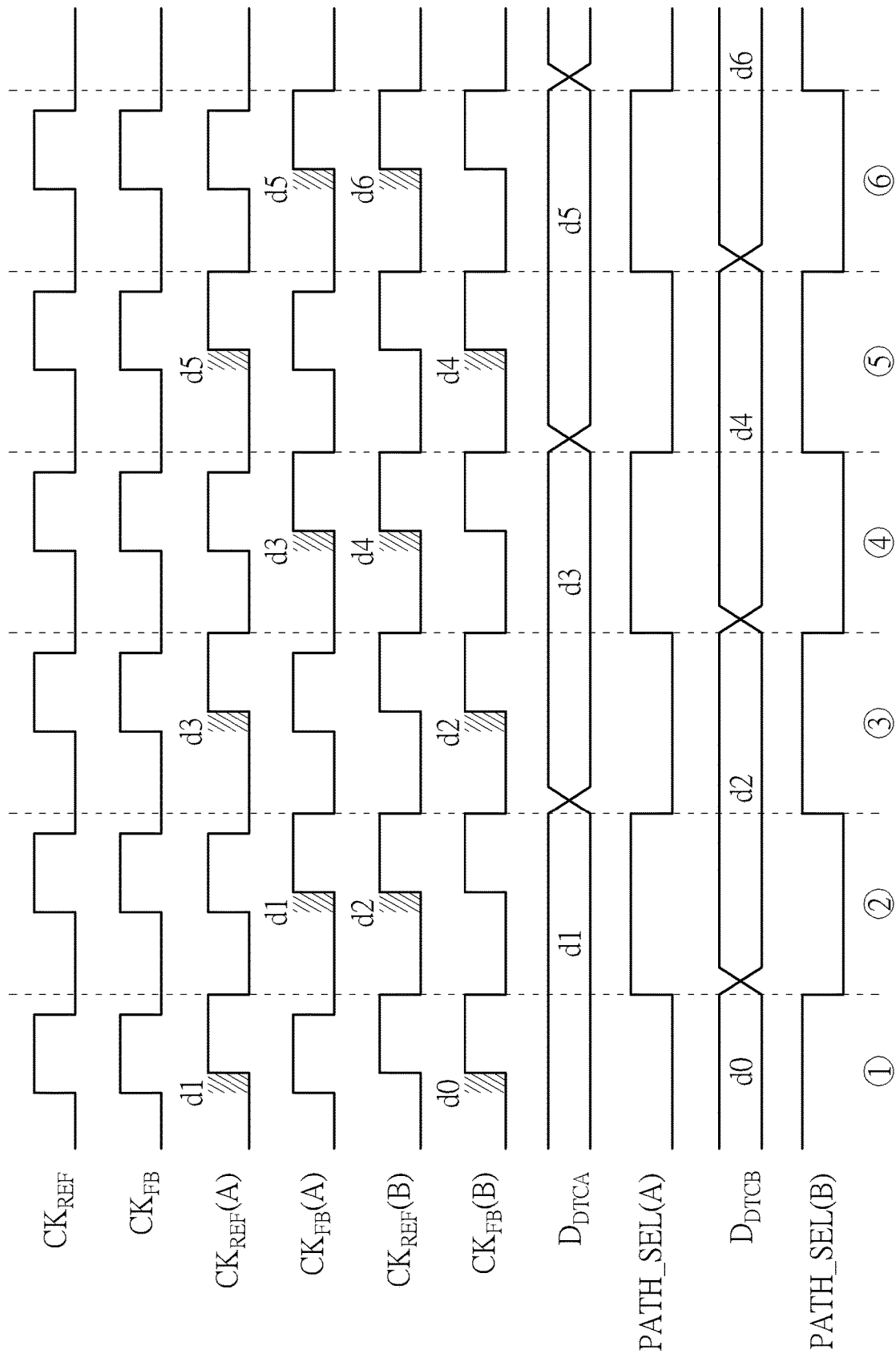
FIG. 3 is a diagram illustrating some signals involved in the phase error compensation circuit shown in FIG. 2 according to an embodiment of the present invention.

FIG. 3 is a diagram illustrating some signals involved in the phase error compensation circuit 100 shown in FIG. 2 according to an embodiment of the present invention. An interval which is illustrated by a circle labeled "1" therein may represent a first cycle of the reference clock $CK_{REF}$, an interval which is illustrated by a circle labeled "2" therein may represent a second cycle of the reference clock $CK_{REF}$, and deduced by analogy, an interval which is illustrated by a circle labeled "6" therein may represent a sixth cycle of the reference clock $CK_{REF}$. In this embodiment, any three consecutive cycles of the reference clock $CK_{REF}$ may be examples of the last cycle, the present cycle and the next cycle of the reference clock $CK_{REF}$ mentioned above. It should be note that each of the delay TA (which is controlled by the encoded code $D_{DTCA}$) and the delay $\tau_B$ (which is controlled by the encoded code $D_{DTCB}$) is updated every two cycles, and the delay TA and the delay $\tau_B$ are updated by turns (e.g. the encoded codes D DTCA and $D_{DTCB}$ are update by turns).

For better illustration, assume that the second cycle is the present cycle. At the last cycle (e.g. the first cycle), the control signals PATH_SEL(A) and PATH_SELb(B) is low (e.g. having a logic value "0") and the control signals PATH_SELb(A) and PATH_SEL(B) is high (e.g. having a logic value "1"). The input swapping circuit 111A may transmit the reference clock $CK_{REF}$ to the output swapping circuit 112A via the DTC 113A from the MUX MA2 to the MUX MA3 for outputting the intermediate reference clock $CK_{REF}(A)$, thereby making the intermediate reference clock $CK_{REF}(A)$ have a delay d1 relative to the reference clock $CK_{REF}$. The input swapping circuit 111A may further transmit the feedback clock $CK_{FB}$ to the output swapping circuit 112A via a first bypass path (e.g. an upper path between the input swapping circuit 111A and the output swapping circuit 112A, which does not go through any DTC) from the MUX MA1 to the MUX MA4 for outputting the intermediate feedback clock $CK_{FB}(A)$, thereby making the intermediate feedback clock $CK_{FB}(A)$ have no delay relative to the feedback clock $CK_{FB}$. In addition, the input swapping circuit 111B may transmit the intermediate reference clock $CK_{REF}(A)$ to the output swapping circuit 112B via a second bypass path (e.g. an upper path between the input swapping circuit 111B and the output swapping circuit 112B, which does not go through any DTC) from the MUX MB1 to the MUX MB3 for outputting the compensated reference clock $CK_{REF}(B)$, thereby making the compensated reference clock $CK_{REF}(B)$ have no delay relative to the intermediate reference clock $CK_{REF}(A)$. The input swapping circuit 111B may further transmit the intermediate feedback clock $CK_{FB}(A)$ to the output swapping circuit 112B via the DTC 113B from the MUX MB2 to the MUX MB4 for outputting the compensated feedback clock $CK_{FB}(B)$, thereby making the compensated feedback clock $CK_{FB}(B)$ have a delay d0 relative to the intermediate feedback clock $CK_{FB}(A)$.

When operations of the fractional-N PLL 10 enters the present cycle (e.g. the second cycle) from the last cycle, the encoded code $D_{DTCA}$ is unchanged and the encoded code $D_{DTCB}$ is updated, making the delay TA provided by the DTC 113A be kept at d1 and the delay $\tau_B$ provided by the DTC 113B be updated to d2 from d0. At the present cycle, the control signals PATH_SEL(A) and PATH_SELb(B) are high (e.g. having the logic value "1") and the control signals PATH_SELb(A) and PATH_SEL(B) are low (e.g. having the logic value "0"). The input swapping circuit 111A may transmit the reference clock $CK_{REF}$ to the output swapping circuit 112A via the first bypass path from the MUX MA1 to the MUX MA3 for outputting the intermediate reference clock $CK_{REF}(A)$, thereby making the intermediate reference clock $CK_{REF}(A)$ have no delay relative to the reference clock $CK_{REF}$. The input swapping circuit 111A may further transmit the feedback clock $CK_{FB}$ to the output swapping circuit 112A via the DTC 113A from the MUX MA2 to the MUX MA4 for outputting the intermediate feedback clock $CK_{FB}(A)$, thereby making the intermediate feedback clock $CK_{FB}(A)$ have the delay d1 relative to the feedback clock $CK_{FB}$. In addition, the input swapping circuit 111B may transmit the intermediate reference clock $CK_{REF}(A)$ to the output swapping circuit 112B via the DTC 113B from the MUX MB2 to the MUX MB3 for outputting the compensated reference clock $CK_{REF}(B)$, thereby making the compensated reference clock $CK_{REF}(B)$ have the delay d2 relative to the intermediate reference clock $CK_{REF}(A)$. The input swapping circuit 111B may further transmit the intermediate feedback clock $CK_{FB}(A)$ to the output swapping circuit 112B via the second bypass path from the MUX MB1 to the MUX MB4 for outputting the compensated feedback clock $CK_{FB}(B)$, thereby making the compensated feedback clock $CK_{FB}(B)$ have no delay relative to the intermediate feedback clock $CK_{FB}(A)$.

When the operations of the fractional-N PLL 10 enters the next cycle (e.g. the third cycle) from the present cycle, the encoded code $D_{DTCA}$ is updated and the encoded code D DTCB is unchanged, making the delay TA provided by the DTC 113A be updated to d3 from d1 and the delay $\tau_B$ provided by the DTC 113B be kept at d2. At the next cycle (e.g. the third cycle), the control signals PATH_SEL(A) and PATH_SELb(B) is low (e.g. having the logic value "0") and the control signals PATH_SELb(A) and PATH_SEL(B) is high (e.g. having the logic value "1"). The input swapping circuit 111A may transmit the reference clock $CK_{REF}$ to the output swapping circuit 112A via the DTC 113A from the MUX MA2 to the MUX MA3 for outputting the intermediate reference clock $CK_{REF}(A)$, thereby making the intermediate reference clock $CK_{REF}(A)$ have the delay d3 relative to the reference clock $CK_{REF}$. The input swapping circuit 111A may further transmit the feedback clock $CK_{FB}$ to the output swapping circuit 112A via the first bypass path from the MUX MA1 to the MUX MA4 for outputting the intermediate feedback clock $CK_{FB}(A)$, thereby making the intermediate feedback clock $CK_{FB}(A)$ have no delay relative to the feedback clock $CK_{FB}$. In addition, the input swapping circuit 111B may transmit the intermediate reference clock $CK_{REF}(A)$ to the output swapping circuit 112B via the second bypass path from the MUX MB1 to the MUX MB3 for outputting the compensated reference clock $CK_{REF}(B)$, thereby making the compensated reference clock $CK_{REF}(B)$ have no delay relative to the intermediate reference clock $CK_{REF}(A)$. The input swapping circuit 111B may further transmit the intermediate feedback clock $CK_{FB}(A)$ to the output swapping circuit 112B via the DTC 113B from the MUX MB2 to the MUX MB4 for outputting the compensated feedback clock $CK_{FB}(B)$, thereby making the compensated feedback clock $CK_{FB}(B)$ have the delay d2 relative to the intermediate feedback clock $CK_{FB}(A)$.

Those skilled in this art should understand detailed operations of the fourth cycle, the fifth cycle and the sixth cycle in this embodiment by referring to the description related to the first cycle, the second cycle and the third cycle mentioned above. Related details are omitted here for brevity.

It should be noted that the delay $\tau_B$ at the present cycle may be determined according to the phase error at the present cycle (which may be predicted according to the accumulated code RR at the present cycle) and the delay TA at the present cycle, and the delay TA at the next cycle may be determined according to the phase error at the next cycle (which may be predicted according to the accumulated code RR at the next cycle) and the delay $\tau_B$ at the next cycle.

TABLE 1

| Input phase error | Pattern of alt-DTC(A) | Pattern of alt-DTC(B) | Output phase error |
|---|---|---|---|
| RR0 | D0 | 0 | RR0 + D0 = 0 |
| RR1 | −D0 | D1 | RR1 − D0 + D1 = 0 |
| RR2 | D2 | −D1 | RR2 + D2 − D1 = 0 |
| RR3 | −D2 | D3 | RR3 − D2 + D3 = 0 |
| RR4 | D4 | −D3 | RR4 + D4 − D3 = 0 |
| RR5 | −D4 | D5 | RR5 − D4 + D5 = 0 |
| RR6 | D6 | −D5 | RR6 + D6 − D5 = 0 |
| RR7 | −D6 | D7 | RR7 − D6 + D7 = 0 |

Table 1 shows an example of operations of the DTC encoder 180 determining the encoded codes $D_{DTCA}$ and $D_{DTCB}$ cycle by cycle. A first column of Table 1 illustrates input phase errors between the reference clock $CK_{REF}$ and the feedback clock $CK_{FB}$ at respective cycles, which may be represented by the accumulated code RR. A second column of Table 1 illustrates phase shift patterns introduced by the alternating DTC 110A at respective cycles (labeled "Pattern of alt-DTC(A)" in a first row of Table 1 for better comprehension). A third column of Table 1 illustrates phase shift patterns introduced by the alternating DTC 110B at respective cycles (labeled "Pattern of alt-DTC(B)" in the first row of Table 1 for better comprehension). A fourth column of Table 1 illustrates output phase errors between the compensated reference clock $CK_{REF}'$ and the compensated feedback clock $CK_{FB}'$ (e.g. the residual phase error mentioned above) at respective cycles, which is expected to be zero.

It is assumed that the delay $\tau_B$ provided by the DTC 113B is zero at a first cycle, and for better illustration of operations of the following cycles, it is further assumed that the delay $\tau_A$ provided by the DTC 113A is applied to the reference clock $CK_{REF}$ and the delay $\tau_B$ provided by the DTC 113B is applied to the feedback clock $CK_{FB}$ at the first cycle, but the present invention is not limited thereto. At the first cycle of the reference clock $CK_{REF}$, the input phase error (e.g. the accumulated code RR) is RR0, the DTC encoder 180 may set the delay $\tau_A$ provided by the DTC 113A to be D0 according to the input phase error, to make the output phase error be zero (e.g. D0=−RR0). At a second cycle of the reference clock $CK_{REF}$, the input phase error (e.g. the accumulated code RR) is RR1, where the signal to be delayed by the DTC 113A is swapped or altered from the reference clock $CK_{REF}$ to the feedback clock $CK_{FB}$ (where the delay $\tau_A$ provided by the DTC 113A is kept at D0), and the signal to be delayed by the DTC 113B is swapped or altered from the feedback clock $CK_{FB}$ to the reference clock $CK_{REF}$. Thus, the phase shift pattern introduced by the alternating DTC 110A therefore becomes "−D0", and the DTC encoder 180 may set the delay $\tau_B$ provided by the DTC 113B at the second cycle to be D1 according to the input phase error at the second cycle and the delay $\tau_A$ provided by the DTC 113A at the second cycle, to make the output phase error be zero (e.g. D1=D0−RR1). At a third cycle of the reference clock $CK_{REF}$, the input phase error (e.g. the accumulated code RR) is RR2, where the signal to be delayed by the DTC 113A is swapped or altered from the feedback clock $CK_{FB}$ to the reference clock $CK_{REF}$, and the signal to be delayed by the DTC 113B is swapped or altered from the reference clock $CK_{REF}$ to the feedback clock $CK_{FB}$ (where the delay $\tau_B$ provided by the DTC 113B is kept at D1). Thus, the phase shift pattern introduced by the alternating DTC 110B therefore becomes "−D1", and the DTC encoder 180 may set the delay $\tau_A$ provided by the DTC 113A at the third cycle to be D2 according to the input phase error at the third cycle and the delay $\tau_B$ provided by the DTC 113B at the third cycle, to make the output phase error be zero (e.g. D2=D1−RR2). At a fourth cycle of the reference clock $CK_{REF}$, the input phase error (e.g. the accumulated code RR) is RR3, where the signal to be delayed by the DTC 113A is swapped or altered from the reference clock $CK_{REF}$ to the feedback clock $CK_{FB}$ (where the delay $\tau_A$ provided by the DTC 113A is kept at D2), and the signal to be delayed by the DTC 113B is swapped or altered from the feedback clock $CK_{FB}$ to the reference clock $CK_{REF}$. Thus, the phase shift pattern introduced by the alternating DTC 110A therefore becomes "−D2", and the DTC encoder 180 may set the delay $\tau_B$ provided by the DTC 113B at the fourth cycle to be D3 according to the input phase error at the fourth cycle and the delay $\tau_A$ provided by the DTC 113A at the fourth cycle, to make the output phase error be zero (e.g. D3=D2−RR3). At a fifth cycle of the reference clock $CK_{REF}$, the input phase error (e.g. the accumulated code RR) is RR4, where the signal to be delayed by the DTC 113A is swapped or altered from the feedback clock $CK_{FB}$ to the reference clock $CK_{REF}$, and the signal to be delayed by the DTC 113B is swapped or altered from the reference clock $CK_{REF}$ to the feedback clock $CK_{FB}$ (where the delay $\tau_B$ provided by the DTC 113B is kept at D3). Thus, the phase shift pattern introduced by the alternating DTC 110B therefore becomes "−D3", and the DTC encoder 180 may set the delay $\tau_A$ provided by the DTC 113A at the fifth cycle to be D4 according to the input phase error at the fifth cycle and the delay $\tau_B$ provided by the DTC 113B at the fifth cycle, to make the output phase error be zero (e.g. D4=D3−RR4). At a sixth cycle of the reference clock $CK_{REF}$, the input phase error (e.g. the accumulated code RR) is RR5, where the signal to be delayed by the DTC 113A is swapped or altered from the reference clock $CK_{REF}$ to the feedback clock $CK_{FB}$ (where the delay $\tau_A$ provided by the DTC 113A is kept at D4), and the signal to be delayed by the DTC 113B is swapped or altered from the feedback clock $CK_{FB}$ to the reference clock $CK_{REF}$. Thus, the phase shift pattern introduced by the alternating DTC 110A therefore becomes "−D4", and the DTC encoder 180 may set the delay $\tau_B$ provided by the DTC 113B at the sixth cycle to be D5 according to the input phase error at the sixth cycle and the delay $\tau_A$ provided by the DTC 113A at the sixth cycle, to make the output phase error be zero (e.g. D5=D4−RR5). At a seventh cycle of the reference clock $CK_{REF}$, the input phase error (e.g. the accumulated code RR) is RR6, where the signal to be delayed by the DTC 113A is swapped or altered from the feedback clock $CK_{FB}$ to the reference clock $CK_{REF}$, and the signal to be delayed by the DTC 113B is swapped or altered from the reference clock $CK_{REF}$ to the feedback clock $CK_{FB}$ (where the delay $\tau_B$ provided by the DTC 113B is kept at D5). Thus, the phase shift pattern introduced by the alternating DTC 110B therefore becomes "−D5", and the DTC encoder 180 may set the delay $\tau_A$ provided by the DTC 113A at the seventh cycle to be D6 according to the input phase error at the seventh cycle and the delay $\tau_B$ provided by the DTC 113B at the seventh cycle, to make the output phase error be zero (e.g. D6=D5−RR6). At an eighth cycle of the reference clock $CK_{REF}$, the input phase error (e.g. the accumulated code RR) is RR7, where the signal to be delayed by the DTC 113A is swapped or altered from the reference clock $CK_{REF}$ to the feedback clock $CK_{FB}$ (where the delay $\tau_A$ provided by the DTC 113A is kept at D6), and the signal to be delayed by the DTC 113B is swapped or altered from the feedback clock $CK_{FB}$ to the reference clock $CK_{REF}$. Thus, the phase shift pattern introduced by the alternating DTC 110A therefore becomes "−D6", and the DTC encoder 180 may set the delay $\tau_B$ provided by the DTC 113B at the eighth cycle to be D7 according to the input phase error at the eighth cycle and the delay $\tau_A$ provided by the DTC 113A at the eighth cycle, to make the output phase error be zero (e.g. D7=D6−RR7).

TABLE 2

| Target DTC delay | Delay(A) | Delay(B) | MMD divisor | Real DTC delay | Accumulated error |
| --- | --- | --- | --- | --- | --- |
| 0.1 | $0.1 + \varepsilon_1$ | −(0) | N | $0.1 + \varepsilon_1$ | $\varepsilon_1$ |
| 0.2 | $-(0.1 + \varepsilon_1)$ | $0.3 + \varepsilon_2$ | N | $0.2 + \varepsilon_2 - \varepsilon_1$ | $\varepsilon_2 - \varepsilon_1$ |
| 0.3 | $0.6 + \varepsilon_3$ | $-(0.3 + \varepsilon_2)$ | N | $0.3 + \varepsilon_3 - \varepsilon_2$ | $\varepsilon_3 - \varepsilon_2$ |
| 0.4 | $-(0.6 + \varepsilon_3)$ | 0 | N + 1 | $0.4 - \varepsilon_3$ | $-\varepsilon_3$ |
| 0.5 | $0.5 + \varepsilon_4$ | −(0) | N | $0.5 + \varepsilon_4$ | $\varepsilon_4$ |

Table 2 shows an example of self-cancellation of DTC errors based on the operations of the phase error compensation circuit 100 mentioned above. A first column of Table 2 (which is labeled "Target DTC delay") illustrates target phase shifts that is required to be generated by the phase error compensation circuit 100 at respective cycles, where it is assumed that the target phase shifts at respective cycles are 0.1, 0.2, 0.3, 0.4 and 0.5 times the cycle period of the oscillation clock $CK_{OUT}$, respectively (referred to as 0.1, 0.2, 0.3, 0.4 and 0.5 for brevity). A second column of Table 2 (which is labeled "Delay(A)") illustrates phase shift patterns including DTC errors (e.g. error introduced by component mismatch within the DTC 113A) introduced by the alternating DTC 110A at the respective cycles. A third column of Table 2 (which is labeled "Delay(B)") illustrates phase shift patterns including DTC errors (e.g. error introduced by component mismatch within the DTC 113B) introduced by the alternating DTC 110B at the respective cycles. A fourth column of Table 2 (which is labeled "MMD divisor") illustrates the variable integer divisor of the MMD 140 at the respective cycles, where N is a positive integer. A fifth column of Table 2 (which is labeled "Real DTC delay") illustrates overall phase shifts including the DTC errors introduced by the phase error compensation circuit 100 (which includes the phase shifts introduced by the alternating DTCs 110A and 110B) at the respective cycles. A sixth column of Table 2 illustrates accumulated errors within the residual phase error at the respective cycles.

At the first cycle of the reference clock $CK_{REF}$, the target phase shift is 0.1, and the DTC encoder 180 may determine that the phase shift pattern introduced by the alternating DTC 110A at the first cycle should be set as "0.1", but this phase shift pattern may be "$0.1+\varepsilon_1$" in practice, where $\varepsilon_1$ may represent the DTC error of the alternating DTC 110A at the first cycle. Assuming that the delay $\tau_B$ provided by the DTC 113B is zero at the first cycle, the overall phase shift introduced by the phase error compensation circuit 100 at the first cycle may be "$0.1+\varepsilon_1$", and the accumulated error at the first cycle may be $\varepsilon_1$. At the second cycle of the reference clock $CK_{REF}$, the target phase shift is 0.2, the phase shift pattern introduced by the alternating DTC 110A at the second cycle becomes "$-(0.1+\varepsilon_1)$", and the DTC encoder 180 may determine that the phase shift pattern introduced by the alternating DTC 110B at the second cycle should be set as "0.3", but this phase shift pattern may become "$0.3+\varepsilon_2$" in practice, where $\varepsilon_2$ may represent the DTC error of the alternating DTC 110B at the second cycle. Thus, the overall phase shift introduced by the phase error compensation circuit 100 at the second cycle may be "$0.2+\varepsilon_2-\varepsilon_1$", and the accumulated error at the first cycle may be "$\varepsilon_2-\varepsilon_1$", where the DTC error $\varepsilon_1$ at the first cycle and the DTC error $\varepsilon_1$ at the second cycle can be self-cancelled. At the third cycle of the reference clock $CK_{REF}$, the target phase shift is 0.3, the phase shift pattern introduced by the alternating DTC 110B at the third cycle becomes "$-(0.3+\varepsilon_2)$", and the DTC encoder 180 may determine that the phase shift pattern introduced by the alternating DTC 110A at the third cycle should be set as "0.6", but this phase shift pattern may become "$0.6+\varepsilon_3$" in practice, where $\varepsilon_3$ may represent the DTC error of the alternating DTC 110A at the third cycle. Thus, the overall phase shift introduced by the phase error compensation circuit 100 at the third cycle may be "$0.3+\varepsilon_3-\varepsilon_2$", and the accumulated error at the first cycle may be "$\varepsilon_3-\varepsilon_2$", where the DTC error $\varepsilon_2$ at the second cycle and the DTC error $\varepsilon_2$ at the third cycle can be self-cancelled.

It should be noted that when a preliminary value of at least one of the delay $\tau_A$ and the delay $\tau_B$ at the present cycle is not less than one cycle period of the oscillation clock $CK_{OUT}$, the variable integer divisor of the MMD 140 at the present cycle may be modified by adding one to an original value of the integer divisor (e.g. changing the variable integer divisor from "N" to "N+1"), where a final value of the at least one of the delay $\tau_A$ and the delay $\tau_B$ at the present cycle is the preliminary value minus the one cycle period of the oscillation clock, and the variable integer divisor returns to the original value (e.g. changing the variable integer divisor from "N+1" to "N") at the next cycle. For example, at the fourth cycle of the reference clock $CK_{REF}$, the target phase shift is 0.4, the phase shift pattern introduced by the alternating DTC 110A at the third cycle becomes "$-(0.6+\varepsilon_3)$", and the DTC encoder 180 may determine that the phase shift pattern introduced by the alternating DTC 110B at the fourth cycle should be set to be "1" if the variable integer divisor is kept at "N". In order to reduce a required programmable range of any of the delay $\tau_A$ and the delay $\tau_B$ for better DTC linearity, the DTC encoder 180 may set the modified code $D_{MMD0}$ to be "1" at the fourth cycle, where the control logic 190 may accordingly set the modified code $D_{MMD}$ to be "1" to make the variable integer divisor become "N+1" at the fourth cycle, which makes the MMD 140 generate a delay of one cycle period of the oscillation clock $CK_{OUT}$, and the control logic 190 may refresh the modified code $D_{MMD}$ to be "0" at a next cycle (e.g. the fifth cycle), making the variable divisor of the MMD 140 return to "N". As the delay of one cycle period of the oscillation clock $CK_{OUT}$ is provided by the MMD 140, the DTC encoder 180 may determine that the phase shift pattern introduced by the alternating DTC 110B at the fourth cycle should be set as "0" (e.g. 1-1=0). Thus, the overall phase shift introduced by the phase error compensation circuit 100 at the fourth cycle may be "$0.4-\varepsilon_3$", and the accumulated error at the first cycle may be "$-\varepsilon_3$", where the DTC error $\varepsilon_3$ at the third cycle and the DTC error $\varepsilon_3$ at the fourth cycle can be self-cancelled. At the fifth cycle of the reference clock $CK_{REF}$, the target phase shift is 0.5, the phase shift pattern introduced by the alternating DTC 110B at the fifth cycle becomes "$-(0)$", and the DTC encoder 180 may determine that the phase shift pattern introduced by the alternating DTC 110A at the fifth cycle should be set as "0.5", but this phase shift pattern may become "$0.5+\varepsilon_4$" in practice, where $\varepsilon_4$ may represent the DTC error of the alternating DTC 110A at the fifth cycle. Thus, the overall phase shift introduced by the phase error compensation circuit 100 at the fifth cycle may be "$0.5+\varepsilon_4$", and the accumulated error at the first cycle may be "$\varepsilon_4$".

Figure 4:
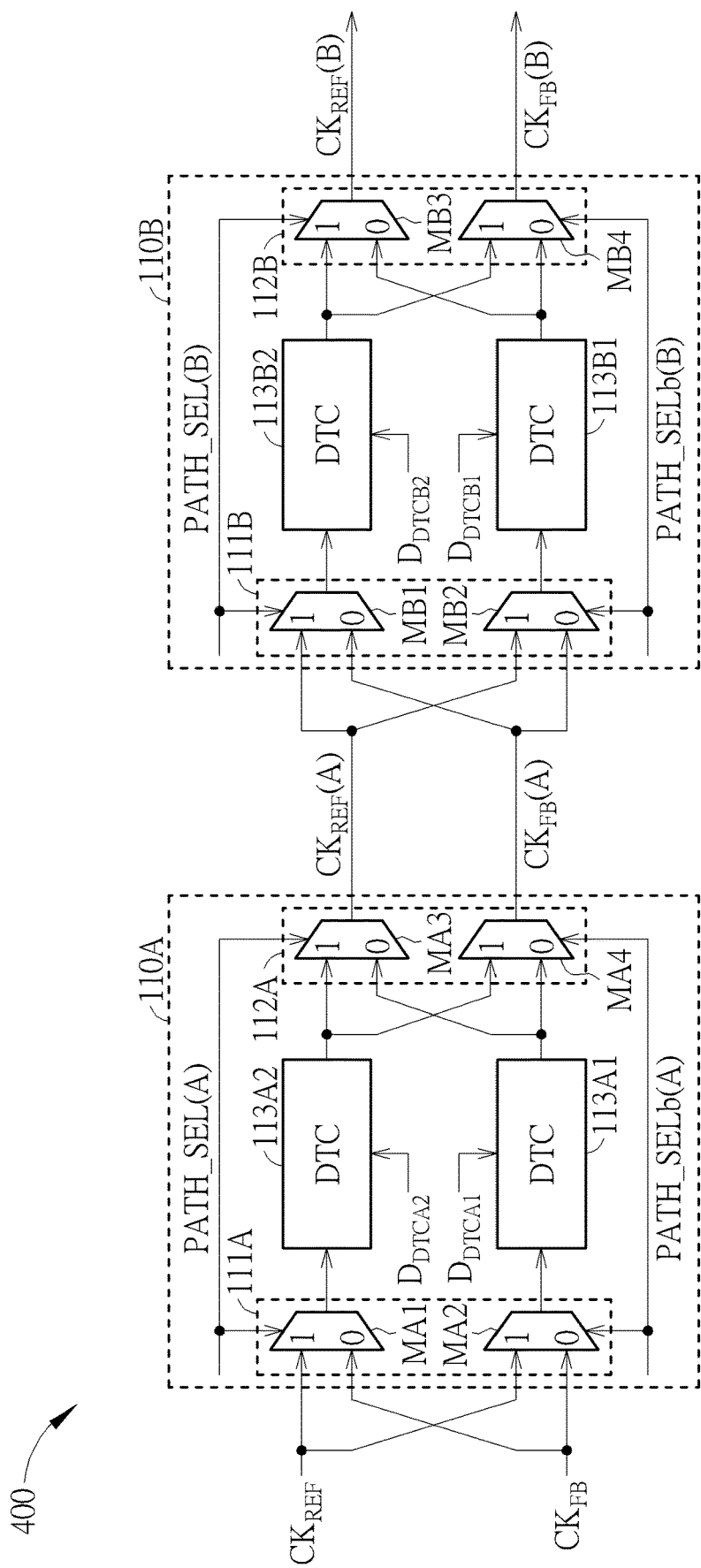
FIG. 4 is a diagram illustrating a phase error compensation circuit with differential architecture according to an embodiment of the present invention.

FIG. 4 is a diagram illustrating a phase error compensation circuit 400 with differential architecture according to an embodiment of the present invention, where the phase error compensation circuit 100 shown in FIG. 1 may be replaced with the phase error compensation circuit 400 in some embodiments. In comparison with the phase error compensation circuit 100 shown in FIG. 2, each of the DTCs 113A and 113B may be alternatively implemented as a pair of DTCs (e.g. a pair of differential DTCs), in order to reduce a required programmable range of a single DTC. For example, the phase error compensation circuit 400 may comprise DTCs 113A1, 113A2, 113B1 and 113B2, where the DTCs 113A1 and 113A2 are coupled between the input swapping circuit 111A and the output swapping circuit 112A, and the DTCs 113B1 and 113B2 are coupled between the input swapping circuit 111B and the output swapping circuit 112B. Based on the phase error compensation circuit 100 shown in FIG. 2, the DTC 113A may be replaced with the DTC 113A1, the first bypass path may be replaced with the DTC 113A2, the DTC 113B may be replaced with the DTC 113B1, and the second bypass path may be replaced with the DTC 113B2, in order to implement a differential architecture, such as the phase error compensation circuit 400.

In this embodiment, the DTC 113A1 is configured to provide a first positive delay such as a delay $\tau_A+$ (which may be controlled according to an encoded code $D_{DTCA1}$ from the DTC encoder 180), the DTC 113A2 is configured to provide a first negative delay such as a delay $\tau_A-$ (which may be controlled according to an encoded code $D_{DTCA2}$ from the DTC encoder 180), the DTC 113B1 is configured to provide a second positive delay such as a delay $\tau_B+$ (which may be controlled according to an encoded code $D_{DTCB1}$ from the DTC encoder 180), and the DTC 113B2 is configured to provide a second negative delay such as a delay $\tau_B-$ (which may be controlled according to an encoded code $D_{DTCB2}$ from the DTC encoder 180). In this embodiment, the delay $\tau_A+$ may represent an increased delay relative to a reference propagation delay from the input swapping circuit 111A to the output swapping circuit 112A, and the delay $\tau_A-$ may represent a reduced delay relative to the reference propagation delay from the input swapping circuit 111A to the output swapping circuit 112A. Thus, when a phase shift "$2\times\tau_A$" needs to be applied, the DTC 113A1 may be configured to provide an effect of "$+\tau_A$" and the DTC 113A2 may be configured to provide an effect of "$-\tau_A$", resulting the needed phase shift "$2\times\tau_A$" (e.g. $(+\tau_A)-(-\tau_A)=2\times\tau_A$). Similarly, the delay $\tau_B+$ may represent an increased delay relative to a reference propagation delay from the input swapping circuit 111B to the output swapping circuit 112B, and the delay $\tau_B-$ may represent a reduced delay relative to the reference propagation delay from the input swapping circuit 111B to the output swapping circuit 112B. Thus, when a phase shift "$2\times\tau_B$" needs to be applied, the DTC 113B1 may be configured to provide an effect of "$+\tau_B$" and the DTC 113B2 may be configured to provide an effect of "$-\tau_B$", resulting the needed phase shift "$2\times\tau_B$" (e.g. $(+\tau_B)-(-\tau_B)=2\times\tau_B$).

At the present cycle, the input swapping circuit 111A may transmit the reference clock $CK_{REF}$ to the output swapping circuit 112A via the DTC 113A2 (e.g. from the MUX MA1 to the MUX MA3) for outputting the intermediate reference clock $CK_{REF}(A)$, and transmit the feedback clock $CK_{FB}$ to the output swapping circuit 112A via the DTC 113A1 (e.g. from the MUX MA2 to the MUX MA4) for outputting the intermediate feedback clock $CK_{FB}(A)$. The input swapping circuit 111B may transmit the intermediate reference clock $CK_{REF}(A)$ to the output swapping circuit 112B via the DTC 113B1 (e.g. from the MUX MB2 to the MUX MB3) for outputting the compensated reference clock $CK_{REF}(B)$, and transmit the intermediate feedback clock $CK_{FB}(A)$ to the output swapping circuit 112B via the DTC 113B2 (e.g. from the MUX MB1 to the MUX MB4) for outputting the compensated feedback clock $CK_{FB}(B)$.

At the next cycle, the input swapping circuit 111A may transmit the reference clock $CK_{REF}$ to the output swapping circuit 112A via the DTC 113A1 (e.g. from the MUX MA2 to the MUX MA3) for outputting the intermediate reference clock $CK_{REF}(A)$, and transmit the feedback clock $CK_{FB}$ to the output swapping circuit 112A via the DTC 113A2 (e.g. from the MUX MA1 to the MUX MA4) for outputting the intermediate feedback clock $CK_{FB}(A)$. The input swapping circuit 111B may transmit the intermediate reference clock $CK_{REF}(A)$ to the output swapping circuit 112B via the DTC 113B2 (e.g. from the MUX MB1 to the MUX MB3) for outputting the compensated reference clock $CK_{REF}(B)$, and transmit the intermediate feedback clock $CK_{FB}(A)$ to the output swapping circuit 112B via the DTC 113B1 (e.g. from the MUX MB2 to the MUX MB4) for outputting the compensated feedback clock $CK_{FB}(B)$.

Detailed operations of the phase error compensation circuit 400, such as the control signals PATH_SEL(A), PATH_SELb(A), PATH_SEL(B) and PATH_SELb(B) and associated effects of respectively applying each of the delays $\tau_A+$, $\tau_A-$, $\tau_B+$ and $\tau_B-$ to corresponding signals, may be deduced by analogy based on the architecture shown in FIG. 4 and details illustrated in the embodiments of FIG. 2 and FIG. 3, and are omitted here for brevity.

Figure 5:
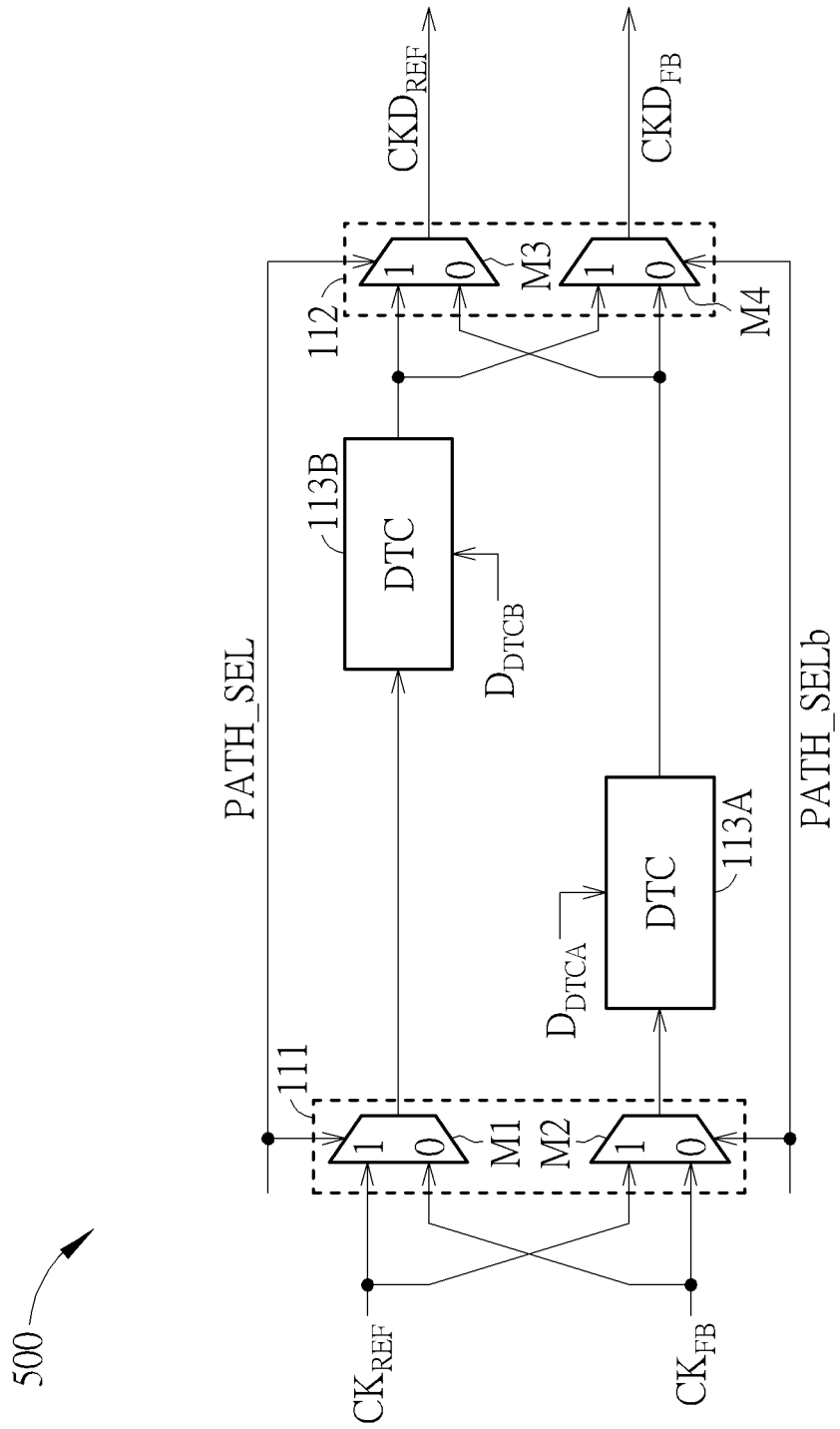
FIG. 5 is a diagram illustrating a phase error compensation circuit according to another embodiment of the present invention.

FIG. 5 is a diagram illustrating a phase error compensation circuit 500 according to another embodiment of the present invention. As shown in FIG. 5, the phase error compensation circuit 500 may comprise an input swapping circuit 111, an output swapping circuit 112, the DTC 113A and the DTC 113B, where each of the DTCs 113A and 113B is coupled between the input swapping circuit 111 and the output swapping circuit 112. In addition, the input swapping circuit 111 may comprise MUXs M1 and M2, and the output swapping circuit 112 may comprise MUXs M3 and M4, where the MUXs M1 and M3 are controlled by a control signal PATH_SEL, and the MUXs M2 and M4 are controlled by a control signal PATH_SELb which is an inverted signal of the control signal PATH_SEL. The control signals PATH_SEL and PATH_SELb may be the same as the control signals PATH_SEL(A) and PATH_SELb(A) shown in FIG. 3, but the present invention is not limited thereto. The input swapping circuit 111 is configured to receive the reference clock $CK_{REF}$ and the feedback clock $CK_{FB}$, and the output swapping circuit 112 is configured to output the compensated reference clock $CKD_{REF}$ and the compensated feedback clock $CKD_{FB}$ according to the delay $\tau_A$ provided by the DTC 113A, the delay $\tau_B$ provided by the DTC 113B, the reference clock $CK_{REF}$ and the feedback clock $CK_{FB}$. In some embodiments, the phase error compensation circuit 100 shown in FIG. 1 may be replaced with the phase error compensation circuit 500, where the compensated reference clock $CKD_{REF}$ and the compensated feedback clock $CKD_{FB}$ may be examples of the compensated reference clock $CK_{REF}'$ and the compensated feedback clock $CK_{FB}'$, but the present invention is not limited thereto.

Based on the architecture of the phase error compensation circuit 100 shown in FIG. 2, four swapping circuits (e.g. the input swapping circuit 111A, the output swapping circuit 112A, the input swapping circuit 111B and the output swapping circuit 112B) may be combined into two swapping circuit (e.g. the input swapping circuit 111 and the output swapping circuit 112) as illustrated by the phase error compensation 500, which can achieve the same effect as the phase error compensation circuit 100.

At the present cycle, the control signal PATH_SEL may be high (e.g. having the logic value "1") and the control signal PATH_SELb may be low (e.g. having the logic value "0") in this embodiment. The input swapping circuit 111 may transmit the reference clock $CK_{REF}$ to the output swapping circuit 112 via the DTC 113B (e.g. from the MUX M1 to the MUX M3) for outputting the compensated reference clock $CKD_{REF}$, thereby making the compensated reference clock $CKD_{REF}$ have the delay $\tau_B$ relative to the reference clock $CK_{REF}$. In addition, the input swapping circuit 111 may transmit the feedback clock $CK_{FB}$ to the output swapping circuit 112 via the DTC 113A (e.g. from the MUX M2 to the MUX M4) for outputting the compensated feedback clock CKD FB, thereby making the compensated feedback clock $CKD_{FB}$ have the delay $\tau_A$ relative to the feedback clock $CK_{REF}$.

At the next cycle, the control signal PATH_SEL may be low (e.g. having the logic value "0") and the control signal PATH_SELb may be high (e.g. having the logic value "1") in this embodiment. The input swapping circuit 111 may transmit the reference clock $CK_{REF}$ to the output swapping circuit 112 via the DTC 113A (e.g. from the MUX M2 to the MUX M3) for outputting the compensated reference clock $CKD_{REF}$, thereby making the compensated reference clock $CKD_{REF}$ have the delay $\tau_A$ relative to the reference clock $CK_{REF}$. In addition, the input swapping circuit 111 may transmit the feedback clock $CK_{FB}$ to the output swapping circuit 112 via the DTC 113B (e.g. from the MUX M1 to the MUX M4) for outputting the compensated feedback clock $CKD_{FB}$, thereby making the compensated feedback clock $CKD_{FB}$ have the delay $\tau_B$ relative to the feedback clock $CK_{FB}$.

Figure 6:
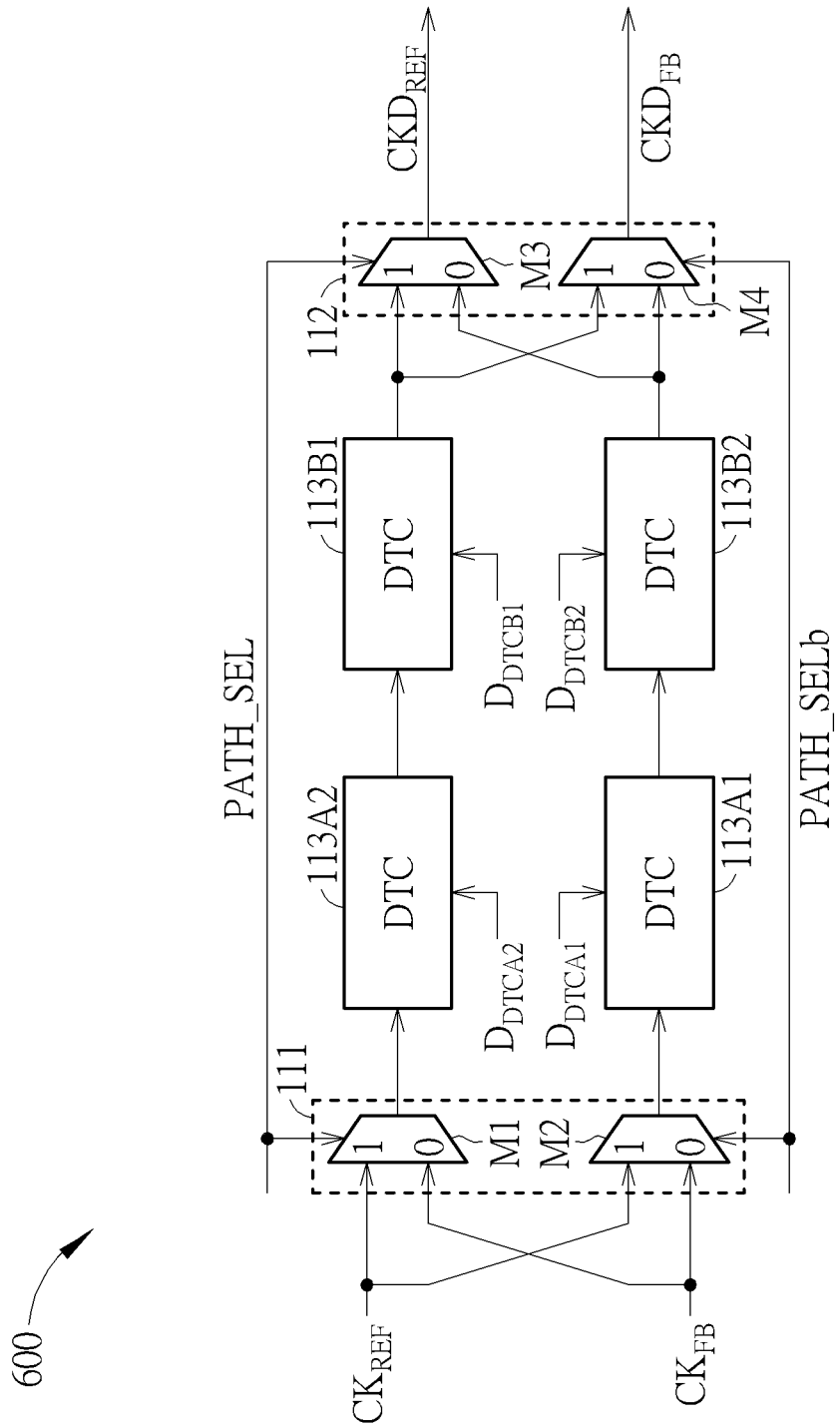
FIG. 6 is a diagram illustrating a phase error compensation circuit with differential architecture according to another embodiment of the present invention.

FIG. 6 is a diagram illustrating a phase error compensation circuit 600 with differential architecture according to another embodiment of the present invention, where the phase error compensation circuit 100 shown in FIG. 1 may be replaced with the phase error compensation circuit 600 in some embodiments. In comparison with the phase error compensation circuit 500 shown in FIG. 5, each of the DTCs 113A and 113B may be alternatively implemented as a pair of DTCs (e.g. a pair of differential DTCs), in order to reduce a required programmable range of a single DTC. For example, the phase error compensation circuit 400 may comprise the DTCs 113A1, 113A2, 113B1 and 113B2. Based on the phase error compensation circuit 500 shown in FIG. 5, the DTC 113A may be replaced with the DTC 113A1, and the DTC 113B may be replaced with the DTC 113B1, where the DTCs 113A1 and 113B2 are connected in series between the input swapping circuit 111 and the output swapping circuit 112, and the DTCs 113A2 and 113B1 are connected in series between the input swapping circuit 111 and the output swapping circuit 112. By the above configuration, a differential architecture may be implemented as illustrated by the phase error compensation circuit 600 shown in FIG. 6.

In this embodiment, the DTC 113A1 is configured to provide a first positive delay such as the delay $\tau_A+$ (which may be controlled according to the encoded code $D_{DTCA1}$ from the DTC encoder 180), the DTC 113A2 is configured to provide a first negative delay such as the delay $\tau_A-$ (which may be controlled according to the encoded code $D_{DTCA2}$ from the DTC encoder 180), the DTC 113B1 is configured to provide a second positive delay such as the delay $\tau_B+$ (which may be controlled according to the encoded code $D_{DTCB1}$ from the DTC encoder 180), and the DTC 113B2 is configured to provide a second negative delay such as the delay $\tau_B-$ (which may be controlled according to the encoded code $D_{DTCB2}$ from the DTC encoder 180). It should be note that operations and control of the DTCs 113A1, 113A2, 113B1 and 113B2 in the embodiment of FIG. 6 are similar to that of the embodiment of FIG. 4, and related details are omitted here for brevity.

At the present cycle, the input swapping circuit 111 may transmit the reference clock $CK_{REF}$ to the output swapping circuit 112 via the DTC 113A2 and the DTC 113B1 (e.g. from the MUX M1 to the MUX M3) for outputting the compensated reference clock $CKD_{REF}$. In addition, the input swapping circuit 111 may transmit the feedback clock $CK_{FB}$ to the output swapping circuit 112 via the DTC 113A1 and the DTC 113B2 (e.g. from the MUX M2 to the MUX M4) for outputting the compensated feedback clock.

At the next cycle, the input swapping circuit 111 may transmit the reference clock $CK_{REF}$ to the output swapping circuit 112 via the DTC 113A1 and the DTC 113B2 (e.g. from the MUX M2 to the MUX M3) for outputting the compensated reference clock $CKD_{REF}$. In addition, the input swapping circuit 111 may transmit the feedback clock $CK_{FB}$ to the output swapping circuit 112 via the DTC 113A2 and the DTC 113B1 (e.g. from the MUX M1 to the MUX M4) for outputting the compensated feedback clock $CKD_{FB}$.

Figure 7:
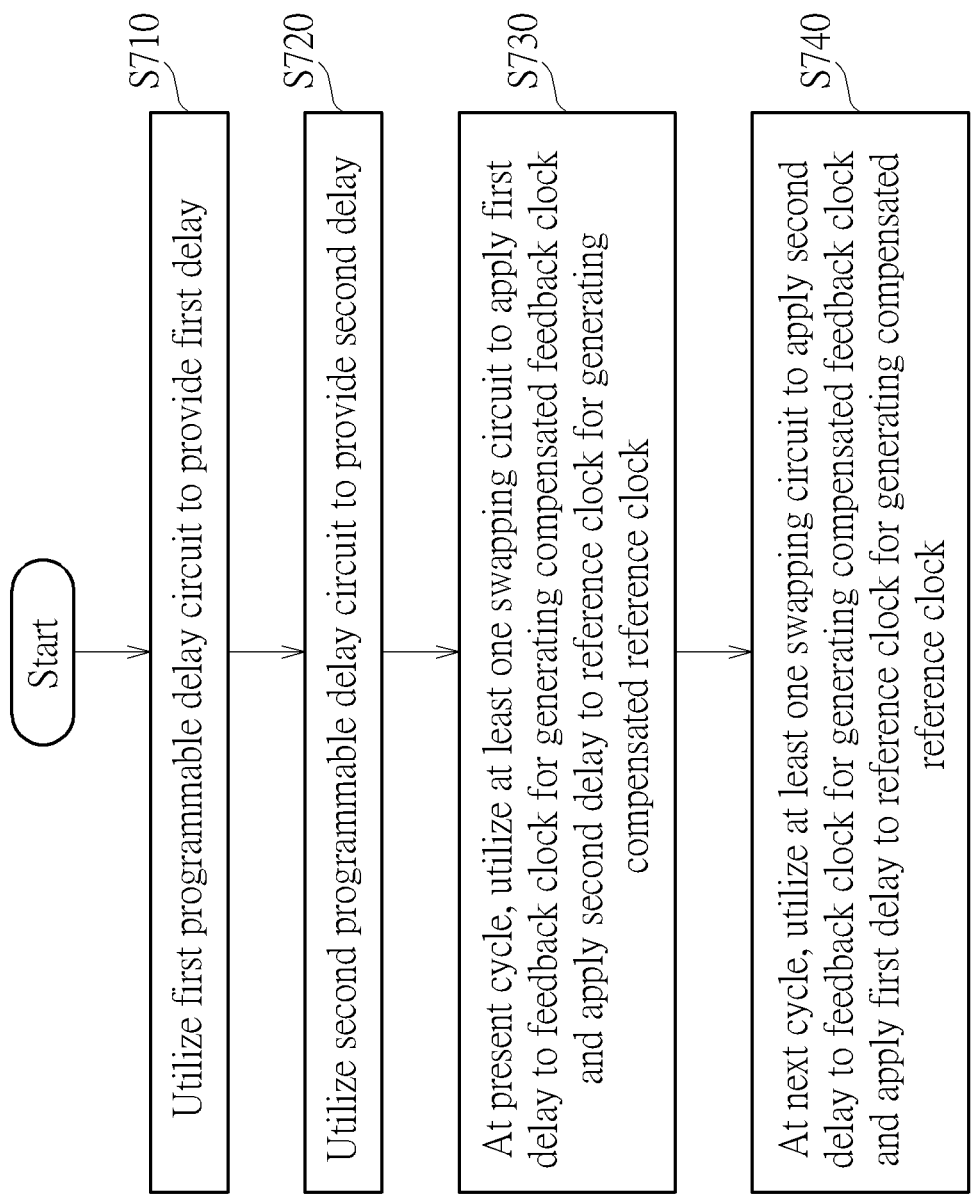
FIG. 7 is a diagram illustrating a working flow of a method for compensating a phase error between a reference clock and a feedback clock according to an embodiment of the present invention.

FIG. 7 is a diagram illustrating a working flow of a method for compensating the phase error (e.g. the input phase error) between the reference clock $CK_{REF}$ and the feedback clock $CK_{FB}$ according to an embodiment of the present invention, where the method is applicable to a phase error compensation circuits such as the phase error compensation circuits 100, 400, 500 and 600. It should be note that the working flow shown in FIG. 7 is for illustrative purposes only, and is not meant to be a limitation of the present invention. For example, one or more steps may be added, deleted or modified in the working flow shown in FIG. 7. In addition, if a same result may be obtained, these steps do not have to be executed in the exact order shown in FIG. 7.

In Step S710, the phase error compensation circuit may utilize a first programmable delay circuit thereof to provide a first delay.

In Step S720, the phase error compensation circuit may utilize a second programmable delay circuit thereof to provide a second delay.

In Step S730, at a present cycle, the phase error compensation circuit may utilize at least one swapping circuit thereof to apply the first delay to the feedback clock for generating a compensated feedback clock and apply the second delay to the reference clock for generating a compensated reference clock.

In Step S740, at a next cycle, the phase error compensation circuit may utilize the at least one swapping circuit to apply the second delay to the feedback clock for generating the compensated feedback clock and apply the first delay to the reference clock for generating the compensated reference clock.

To summarize, the embodiments of the present invention configure the first delay at the present cycle to be substantially equal to the first delay at a last cycle, and configure the second delay at the present cycle to be substantially equal to the second delay at the next cycle, in order to achieve the purpose of DTC error self-cancellation. More particularly, when one of the first delay and the second delay is fixed (e.g. having the same value at the last cycle and the present cycle) for performing the DTC error self-cancellation, the other of the first delay and the second delay may be configured to be set as a target value that is capable of minimize the residual phase error. Thus, the phase error compensation circuit of the present invention can minimize the residual phase error in a fractional-N PLL without utilizing complex DTC calibration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase error compensation circuit for compensating a phase error between a reference clock and a feedback clock, comprising:
    a first programmable delay circuit, configured to provide a first delay;
    a second programmable delay circuit, configured to provide a second delay; and
    at least one swapping circuit, coupled to the first programmable delay circuit and the second programmable delay circuit, configured to output a compensated reference clock and a compensated feedback clock according to the first delay, the second delay, the reference clock and the feedback clock;
    wherein:
        at a present cycle, the at least one swapping circuit is configured to apply the first delay to the feedback clock for generating the compensated feedback clock and apply the second delay to the reference clock for generating the compensated reference clock;
        at a next cycle, the at least one swapping circuit is configured to apply the second delay to the feedback clock for generating the compensated feedback clock and apply the first delay to the reference clock for generating the compensated reference clock;
        the first delay at the present cycle is substantially equal to the first delay at a last cycle, and the second delay at the present cycle is substantially equal to the second delay at the next cycle; and
        the second delay at the present cycle is determined according to the phase error at the present cycle and the first delay at the present cycle, and the first delay at the next cycle is determined according to the phase error at the next cycle and the second delay at the next cycle.

2. The phase error compensation circuit of claim 1, wherein each of the first delay and the second delay is updated every two cycles.

3. The phase error compensation circuit of claim 1, wherein the feedback clock is generated by performing a frequency division upon an oscillation clock with an integer divisor, and when a preliminary value of at least one of the first delay and the second delay at the present cycle is not less than one cycle period of the oscillation clock, the integer divisor at the present cycle is modified by adding one to an original value of the integer divisor, a final value of the at least one of the first delay and the second delay at the present cycle is the preliminary value minus the one cycle period of the oscillation clock, and the integer divisor returns to the original value at the next cycle.

4. The phase error compensation circuit of claim 1, wherein the at least one swapping circuit comprises:
    a first input swapping circuit, configured to receive the reference clock and the feedback clock;
    a first output swapping circuit, configured to output an intermediate reference clock and an intermediate feedback clock according to the first delay, the reference clock and the feedback clock;

a second input swapping circuit, configured to receive the intermediate reference clock and the intermediate feedback clock; and a second output swapping circuit, configured to output the compensated reference clock and the compensated feedback clock according to the second delay, the intermediate reference clock and the intermediate feedback clock;

wherein the first programmable delay circuit is coupled between the first input swapping circuit and the first output swapping circuit, and the second programmable delay circuit is coupled between the second input swapping circuit and the second output swapping circuit.

5. The phase error compensation circuit of claim 4, wherein:

at the present cycle, the first input swapping circuit transmits the reference clock to the first output swapping circuit via a first bypass path for outputting the intermediate reference clock and transmits the feedback clock to the first output swapping circuit via the first programmable delay circuit for outputting the intermediate feedback clock, and the second input swapping circuit transmits the intermediate reference clock to the second output swapping circuit via the second programmable delay circuit for outputting the compensated reference clock and transmits the intermediate feedback clock to the second output swapping circuit via a second bypass path for outputting the compensated feedback clock; and at the next cycle, the first input swapping circuit transmits the reference clock to the first output swapping circuit via the first programmable delay circuit for outputting the intermediate reference clock and transmits the feedback clock to the first output swapping circuit via the first bypass path for outputting the intermediate feedback clock, and the second input swapping circuit transmits the intermediate reference clock to the second output swapping circuit via the second bypass path for outputting the compensated reference clock and transmits the intermediate feedback clock to the second output swapping circuit via the second programmable delay circuit for outputting the compensated feedback clock.

6. The phase error compensation circuit of claim 4, wherein the first programmable delay circuit is a first positive programmable delay circuit, the second programmable delay circuit is a second positive programmable delay circuit, the first delay is a first positive delay, the second delay is a second positive delay, and the phase error compensation circuit further comprises:

a first negative programmable delay circuit, coupled between the first input swapping circuit and the first output swapping circuit, configured to provide a first negative delay;

a second negative programmable delay circuit, coupled between the second input swapping circuit and the second output swapping circuit, configured to provide a second negative delay;

wherein:

at the present cycle, the first input swapping circuit transmits the reference clock to the first output swapping circuit via the first negative delay circuit for outputting the intermediate reference clock and transmits the feedback clock to the first output swapping circuit via the first positive delay circuit for outputting the intermediate feedback clock, and the second input swapping circuit transmits the intermediate reference clock to the second output swapping circuit via the second positive delay circuit for outputting the compensated reference clock and transmits the intermediate feedback clock to the second output swapping circuit via the second negative delay circuit for outputting the compensated feedback clock; and at the next cycle, the first input swapping circuit transmits the reference clock to the first output swapping circuit via the first positive delay circuit for outputting the intermediate reference clock and transmits the feedback clock to the first output swapping circuit via the first negative delay circuit for outputting the intermediate feedback clock, and the second input swapping circuit transmits the intermediate reference clock to the second output swapping circuit via the second negative delay circuit for outputting the compensated reference clock and transmits the intermediate feedback clock to the second output swapping circuit via the second positive delay circuit for outputting the compensated feedback clock.

7. The phase error compensation circuit of claim 1, wherein the at least one swapping circuit comprises:

an input swapping circuit, configured to receive the reference clock and the feedback clock; and an output swapping circuit, configured to output the compensated reference clock and the compensated feedback clock according to the first delay, the second delay, the reference clock and the feedback clock;

wherein each of the first programmable delay circuit and the second programmable delay circuit is coupled between the input swapping circuit and the output swapping circuit.

8. The phase error compensation circuit of claim 7, wherein:

at the present cycle, the input swapping circuit transmits the reference clock to the output swapping circuit via the second programmable delay circuit for outputting the compensated reference clock and transmits the feedback clock to the output swapping circuit via the first programmable delay circuit for outputting the compensated feedback clock; and at the next cycle, the input swapping circuit transmits the reference clock to the output swapping circuit via the first programmable delay circuit for outputting the compensated reference clock and transmits the feedback clock to the output swapping circuit via the second programmable delay circuit for outputting the compensated feedback clock.

9. The phase error compensation circuit of claim 7, wherein the first programmable delay circuit is a first positive programmable delay circuit, the second programmable delay circuit is a second positive programmable delay circuit, the first delay is a first positive delay, the second delay is a second positive delay, and the phase error compensation circuit further comprises:

a first negative programmable delay circuit, configured to provide a first negative delay, wherein the first negative programmable delay circuit and the second positive programmable delay circuit are connected in series between the input swapping circuit and the output swapping circuit; and a second negative programmable delay circuit, configured to provide a second negative delay, wherein the first positive programmable delay circuit and the second negative programmable delay circuit are connected in series between the input swapping circuit and the output swapping circuit;

wherein:
at the present cycle, the input swapping circuit transmits the reference clock to the output swapping circuit via the first negative programmable delay circuit and the second positive programmable delay circuit for outputting the compensated reference clock and transmits the feedback clock to the output swapping circuit via the first positive programmable delay circuit and the second negative programmable delay circuit for outputting the compensated feedback clock; and at the next cycle, the input swapping circuit transmits the reference clock to the output swapping circuit via the first positive programmable delay circuit and the second negative programmable delay circuit for outputting the compensated reference clock and transmits the feedback clock to the output swapping circuit via the first negative programmable delay circuit and the second positive programmable delay circuit for outputting the compensated feedback clock.

10. A method for compensating a phase error between a reference clock and a feedback clock, applicable to a phase error compensation circuit, the method comprising:
utilizing a first programmable delay circuit of the phase error compensation circuit to provide a first delay;
utilizing a second programmable delay circuit of the phase error compensation circuit to provide a second delay;
at a present cycle, utilizing at least one swapping circuit of the phase error compensation circuit to apply the first delay to the feedback clock for generating a compensated feedback clock and apply the second delay to the reference clock for generating a compensated reference clock; and
at a next cycle, utilizing the at least one swapping circuit to apply the second delay to the feedback clock for generating the compensated feedback clock and apply the first delay to the reference clock for generating the compensated reference clock;
wherein the first delay at the present cycle is substantially equal to the first delay at a last cycle, the second delay at the present cycle is substantially equal to the second delay at the next cycle, the second delay at the present cycle is determined according to the phase error at the present cycle and the first delay at the present cycle, and the first delay at the next cycle is determined according to the phase error at the next cycle and the second delay at the next cycle.

11. The method of claim 10, wherein each of the first delay and the second delay is updated every two cycles.

12. The method of claim 10, wherein the feedback clock is generated by performing a frequency division upon an oscillation clock with an integer divisor, and the method further comprises:
in response to a preliminary value of at least one of the first delay and the second delay at the present cycle being not less than one cycle period of the oscillation clock, modifying the integer divisor at the present cycle by adding one to an original value of the integer divisor, wherein a final value of the at least one of the first delay and the second delay at the present cycle is the preliminary value minus the one cycle period of the oscillation clock; and controlling the integer divisor to return to the original value at the next cycle.

13. The method of claim 10, further comprising:
utilizing a first input swapping circuit of the at least one swapping circuit to receive the reference clock and the feedback clock;
utilizing a first output swapping circuit of the at least one swapping circuit to output an intermediate reference clock and an intermediate feedback clock according to the first delay, the reference clock and the feedback clock;
utilizing a second input swapping circuit of the at least one swapping circuit to receive the intermediate reference clock and the intermediate feedback clock; and
utilizing a second output swapping circuit of the at least one swapping circuit to output the compensated reference clock and the compensated feedback clock according to the second delay, the intermediate reference clock and the intermediate feedback clock;
wherein the first programmable delay circuit is coupled between the first input swapping circuit and the first output swapping circuit, and the second programmable delay circuit is coupled between the second input swapping circuit and the second output swapping circuit.

14. The method of claim 13, wherein:
at the present cycle, utilizing the at least one swapping circuit of the phase error compensation circuit to apply the first delay to the feedback clock for generating the compensated feedback clock and apply the second delay to the reference clock for generating the compensated reference clock comprises:
utilizing the first input swapping circuit to transmit the reference clock to the first output swapping circuit via a first bypass path for outputting the intermediate reference clock and transmit the feedback clock to the first output swapping circuit via the first programmable delay circuit for outputting the intermediate feedback clock; and
utilizing the second input swapping circuit to transmit the intermediate reference clock to the second output swapping circuit via the second programmable delay circuit for outputting the compensated reference clock and transmit the intermediate feedback clock to the second output swapping circuit via a second bypass path for outputting the compensated feedback clock; and
at the next cycle, utilizing the at least one swapping circuit to apply the second delay to the feedback clock for generating the compensated feedback clock and apply the first delay to the reference clock for generating the compensated reference clock comprises:
utilizing the first input swapping circuit to transmit the reference clock to the first output swapping circuit via the first programmable delay circuit for outputting the intermediate reference clock and transmit the feedback clock to the first output swapping circuit via the first bypass path for outputting the intermediate feedback clock; and
utilizing the second input swapping circuit to transmit the intermediate reference clock to the second output swapping circuit via the second bypass path for outputting the compensated reference clock and transmit the intermediate feedback clock to the second output swapping circuit via the second programmable delay circuit for outputting the compensated feedback clock.

15. The method of claim 13, wherein the first programmable delay circuit is a first positive programmable delay circuit, the second programmable delay circuit is a second positive programmable delay circuit, the first delay is a first positive delay, the second delay is a second positive delay, and the method further comprises:

utilizing a first negative programmable delay circuit of the phase error compensation circuit to provide a first negative delay; and utilizing a second negative programmable delay circuit of the phase error compensation circuit to provide a second negative delay;

wherein:

at the present cycle, utilizing the at least one swapping circuit of the phase error compensation circuit to apply the first delay to the feedback clock for generating the compensated feedback clock and apply the second delay to the reference clock for generating the compensated reference clock comprises:

utilizing the first input swapping circuit to transmit the reference clock to the first output swapping circuit via the first negative delay circuit for outputting the intermediate reference clock and transmit the feedback clock to the first output swapping circuit via the first positive delay circuit for outputting the intermediate feedback clock; and utilizing the second input swapping circuit to transmit the intermediate reference clock to the second output swapping circuit via the second positive delay circuit for outputting the compensated reference clock and transmit the intermediate feedback clock to the second output swapping circuit via the second negative delay circuit for outputting the compensated feedback clock; and at the next cycle, utilizing the at least one swapping circuit to apply the second delay to the feedback clock for generating the compensated feedback clock and apply the first delay to the reference clock for generating the compensated reference clock comprises:

utilizing the first input swapping circuit to transmit the reference clock to the first output swapping circuit via the first positive delay circuit for outputting the intermediate reference clock and transmit the feedback clock to the first output swapping circuit via the first negative delay circuit for outputting the intermediate feedback clock; and utilizing the second input swapping circuit to transmit the intermediate reference clock to the second output swapping circuit via the second negative delay circuit for outputting the compensated reference clock and transmit the intermediate feedback clock to the second output swapping circuit via the second positive delay circuit for outputting the compensated feedback clock.

16. The method of claim 10, further comprising:

utilizing an input swapping circuit of the at least one swapping circuit to receive the reference clock and the feedback clock; and utilizing an output swapping circuit of the at least one swapping circuit to output the compensated reference clock and the compensated feedback clock according to the first delay, the second delay, the reference clock and the feedback clock;

wherein each of the first programmable delay circuit and the second programmable delay circuit is coupled between the input swapping circuit and the output swapping circuit.

17. The method of claim 16, wherein:

at the present cycle, utilizing the at least one swapping circuit of the phase error compensation circuit to apply the first delay to the feedback clock for generating the compensated feedback clock and apply the second delay to the reference clock for generating the compensated reference clock comprises:

utilizing the input swapping circuit to transmit the reference clock to the output swapping circuit via the second programmable delay circuit for outputting the compensated reference clock and transmit the feedback clock to the output swapping circuit via the first programmable delay circuit for outputting the compensated feedback clock; and at the next cycle, utilizing the at least one swapping circuit to apply the second delay to the feedback clock for generating the compensated feedback clock and apply the first delay to the reference clock for generating the compensated reference clock comprises:

utilizing the input swapping circuit to transmit the reference clock to the output swapping circuit via the first programmable delay circuit for outputting the compensated reference clock and transmits the feedback clock to the output swapping circuit via the second programmable delay circuit for outputting the compensated feedback clock.

18. The method of claim 16, wherein the first programmable delay circuit is a first positive programmable delay circuit, the second programmable delay circuit is a second positive programmable delay circuit, the first delay is a first positive delay, the second delay is a second positive delay, and the method further comprises:

utilizing a first negative programmable delay circuit to provide a first negative delay, wherein the first negative programmable delay circuit and the second positive programmable delay circuit are connected in series between the input swapping circuit and the output swapping circuit; and utilizing a second negative programmable delay circuit to provide a second negative delay, wherein the first positive programmable delay circuit and the second negative programmable delay circuit are connected in series between the input swapping circuit and the output swapping circuit;

wherein:

at the present cycle, utilizing the at least one swapping circuit of the phase error compensation circuit to apply the first delay to the feedback clock for generating the compensated feedback clock and apply the second delay to the reference clock for generating the compensated reference clock comprises:

utilizing the input swapping circuit to transmit the reference clock to the output swapping circuit via the first negative programmable delay circuit and the second positive programmable delay circuit for outputting the compensated reference clock and transmit the feedback clock to the output swapping circuit via the first positive programmable delay circuit and the second negative programmable delay circuit for outputting the compensated feedback clock; and at the next cycle, utilizing the at least one swapping circuit to apply the second delay to the feedback clock for generating the compensated feedback clock and apply the first delay to the reference clock for generating the compensated reference clock comprises:

utilizing the input swapping circuit to transmit the reference clock to the output swapping circuit via the first positive programmable delay circuit and the second negative programmable delay circuit for outputting the compensated reference clock and transmit the feedback clock to the output swapping circuit via the first negative programmable delay circuit and the second positive programmable delay circuit for outputting the compensated feedback clock.

* * * * *